US008195466B2

(12) United States Patent
Carminati et al.

(10) Patent No.: US 8,195,466 B2
(45) Date of Patent: Jun. 5, 2012

(54) METHODS AND SYSTEMS FOR SIGHT IMPAIRED WIRELESS CAPABILITY

(75) Inventors: Franco Carminati, Lecco (IT); Francesco Levantini, Milan (IT); Giuseppe Vendramin, Bergamo (IT)

(73) Assignee: International Business Machines Corporation, Armonk, NY (US)

( * ) Notice: Subject to any disclaimer, the term of this patent is extended or adjusted under 35 U.S.C. 154(b) by 1027 days.

(21) Appl. No.: 12/138,571

(22) Filed: Jun. 13, 2008

(65) Prior Publication Data

US 2009/0313021 A1 Dec. 17, 2009

(51) Int. Cl.

| | |
|---|---|
| ***G10L 13/00*** | (2006.01) |
| ***G10L 21/06*** | (2006.01) |
| ***G10L 21/00*** | (2006.01) |
| ***G09B 21/00*** | (2006.01) |
| ***H03M 7/00*** | (2006.01) |
| ***G06F 9/45*** | (2006.01) |

(52) U.S. Cl. ........ 704/271; 704/258; 704/260; 704/275; 434/112; 341/50; 717/136

(58) Field of Classification Search .................. 704/258, 704/260, 271, 275; 434/112; 341/50; 717/136
See application file for complete search history.

(56) References Cited

U.S. PATENT DOCUMENTS 6,665,642 B2 * 12/2003 Kanevsky et al. ............ 704/260
7,072,328 B2 7/2006 Shen et al.
7,095,825 B2 8/2006 James et al.
7,216,287 B2 * 5/2007 Colson et al. ................. 715/239
2002/0194587 A1 12/2002 Lampton et al.
2003/0061317 A1 * 3/2003 Brown et al. ................. 709/221
2004/0218451 A1 11/2004 Said et al.
2005/0042581 A1 2/2005 Oh et al.
2006/0095848 A1 5/2006 Naik
2007/0055938 A1 3/2007 Herring et al.
2009/0313641 A1 * 12/2009 Chou et al. .................... 719/320

OTHER PUBLICATIONS

"Scansoft Launches SpeechPak Talks for Speech-Enabled Mobile Phones." Business Wire. Nov. 16, 2004.*
"SpeechPAK TALKS". Scansoft. 2004.*
Lanigan, P., Paulos, A, Williams, A., and Narasimhan, P. Trinetra: Assistive Technologies for the Blind. Technical Report CMU-CyLab-06-006, CMU, Pittsburgh, PA, 2006.*
Toth, B. et al. Speech Enabled GPS Based Navigation System in Hungarian for Blind People on Symbian Based Mobile Devices, Budapest University of Technology and Economics, Department of Telecommunications and Media Informatics, 2007.*

* cited by examiner

*Primary Examiner* — Paras Shah
(74) *Attorney, Agent, or Firm* — Cantor Colburn LLP; Andrew Bauer

(57) ABSTRACT

A method for sending data to a sight impaired user, the method comprising, receiving data from a data resource, determining whether the data is compatible with a Symbian API, transcoding the data into a first format compatible with the Symbian API, determining whether the data is compatible with a TALKS filter, transcoding the data into a second format compatible with the TALKS filter, determining whether the data is usable by a sight impaired user, transcoding the data into a third format usable by a sight impaired user responsive to determining that the data is not usable by a sight impaired user, converting a data type definition associated with the data into a format compatible with a user profile, sending the received data to a user mobile device, wherein the mobile device is operative to convert the data into an audible output.

1 Claim, 2 Drawing Sheets

METHODS AND SYSTEMS FOR SIGHT IMPAIRED WIRELESS CAPABILITY

BACKGROUND OF THE INVENTION

1. Field of the Invention

This invention relates generally to a method and system for improving sight impaired access to data in mobile wireless devices.

2. Description of Background

Many users of wireless devices such as, for example, mobile telephones and personal data assistants are sight impaired. The users may be completely blind, or may have a sight impairment that prevents them from reading text on wireless devices with small screens.

Sight impaired users often use text reading software with a wireless device that enables a user to operate the wireless device without using the screen. Advances in wireless devices have enabled them to receive a variety of types of data, such as, for example, communications data via text and voice, data from software applications, and other information data from sources such as web pages and databases.

The types of data may also be transmitted and received through a number of systems that use different types of signals, for example, the Internet, intranet networks, voice networks, the Global System for Mobile communications (GSM), WiFi, the Universal Mobile Telecommunications System (UMTS), and the General Packet Radio System (GPRS). Each of the above systems uses different types of signals to transmit data. Additionally, the different data types and signal types use different communications protocols. The complexity of the available data types, signal types and protocols causes difficulty in enabling a mobile device to access the data types and output the data in a format that may be accessed by a sight impaired user.

SUMMARY OF THE INVENTION

The shortcomings of the prior art are overcome and additional advantages are achieved through an exemplary method for sending data to a sight impaired user, the method comprising, receiving data from a data resource, determining whether the data is compatible with a Symbian API, transcoding the data into a first format compatible with the Symbian API responsive to determining that the data is not compatible with the Symbian API, determining whether the data is compatible with a TALKS filter, transcoding the data into a second format compatible with the TALKS filter responsive to determining that the data is not compatible with a TALKS filter, determining whether the data is usable by a sight impaired user, transcoding the data into a third format usable by a sight impaired user responsive to determining that the data is not usable by a sight impaired user, converting a data type definition associated with the data into a format compatible with a user profile, sending the received data to a user mobile device, wherein the mobile device is operative to convert the data into an audible output.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Systems and methods involving computing correlation anomaly scores are provided. Several exemplary methods are described.

In this regard, wireless communications devices such as, for example, mobile telephones and personal data assistants (PDAs) may be used to access a variety of information from a variety of sources. For example, cellular telephones may be used to access Internet websites, databases, text messages, and other types of information. Often this information is available over a network that uses a variety of protocols depending on the type of information and the applications used to access the information. Sight impaired users often have difficulty accessing this information because the screens on mobile devices are often difficult to read. Some users may not be able to see at all. Thus, to access information, the information must be converted from text form to speech form.

Figure 1:
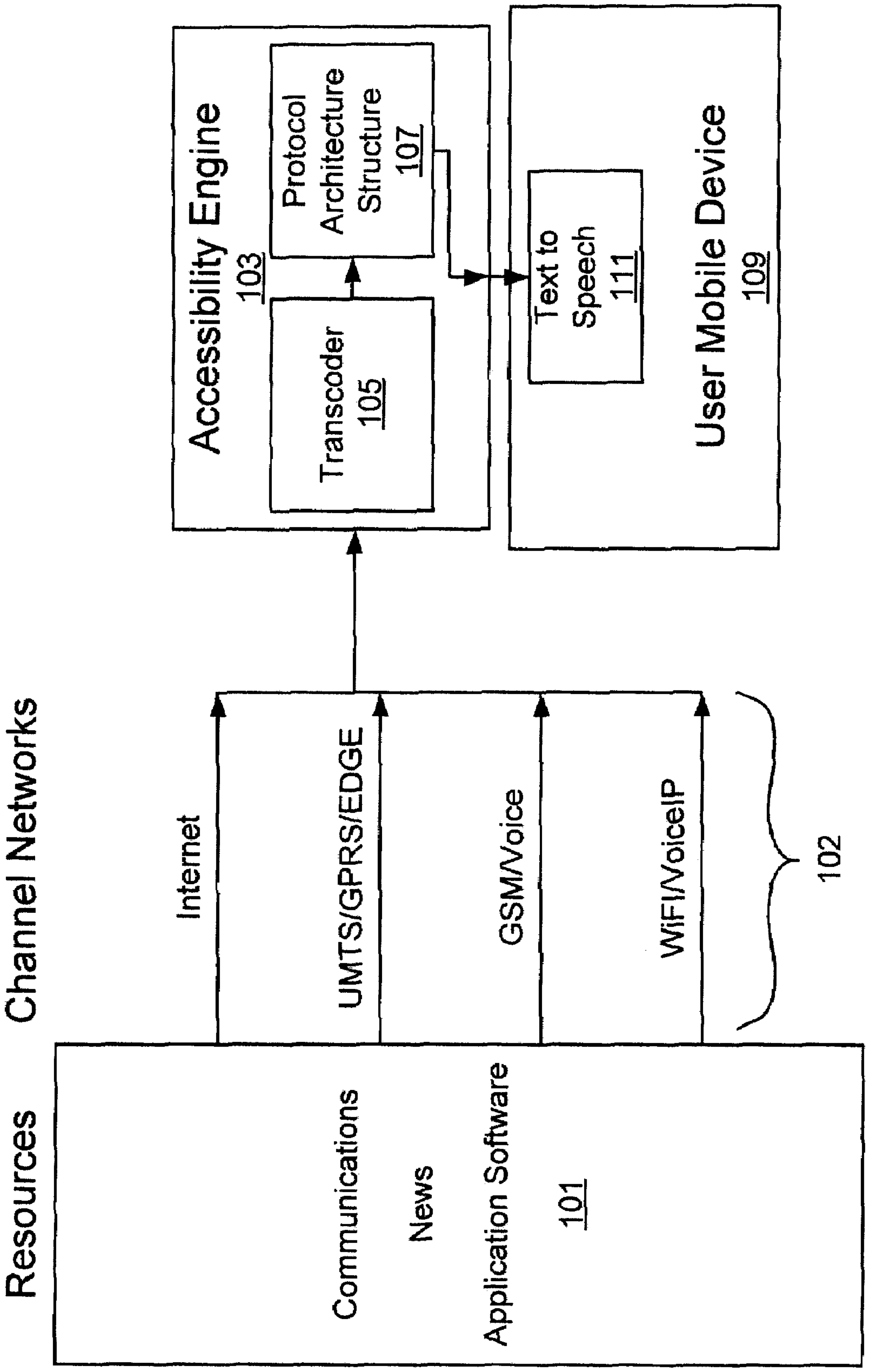
FIG. 1 illustrates an exemplary system for sight impaired mobile access.

FIG. 1 illustrates a system for accessing information via text to speech, system 100. System 100 includes resources 101. Resources 101 may include, for example communications data, news data, and application software. The data and applications from the resources 101 are sent via channel networks 102 to an accessibility engine 103. The channel networks 102, may include, for example, the Internet, the Universal Mobile Telecommunications System (UMTS), General Packet Radio Service (GPRS), Enhanced Data rates for GSM Environment (EDGE), Global System for Mobile communications (GSM), voice, WiFi, and voice over IP (VoiceIP). Data from the channel networks is received by the accessibility engine 103 that includes a transcoder 105 and a protocol architecture structure (PAS) 107. The accessibility engine 109 outputs to a text to speech feature 111 in the user mobile device 109 such as, for example, a mobile phone or a PDA.

In operation, a user of the user mobile device 109 may request data or have data automatically sent from the resources 101. The resources 101 send the data via the channel networks 102 in a data signal. The accessibility engine 103 receives the data signal from the channel networks 102. The transcoder 105 receives the data signal. The data signal may be in usual communication format such as, for example, Data, File content, Scrambled data, commands, text, etc.

Figure 2:
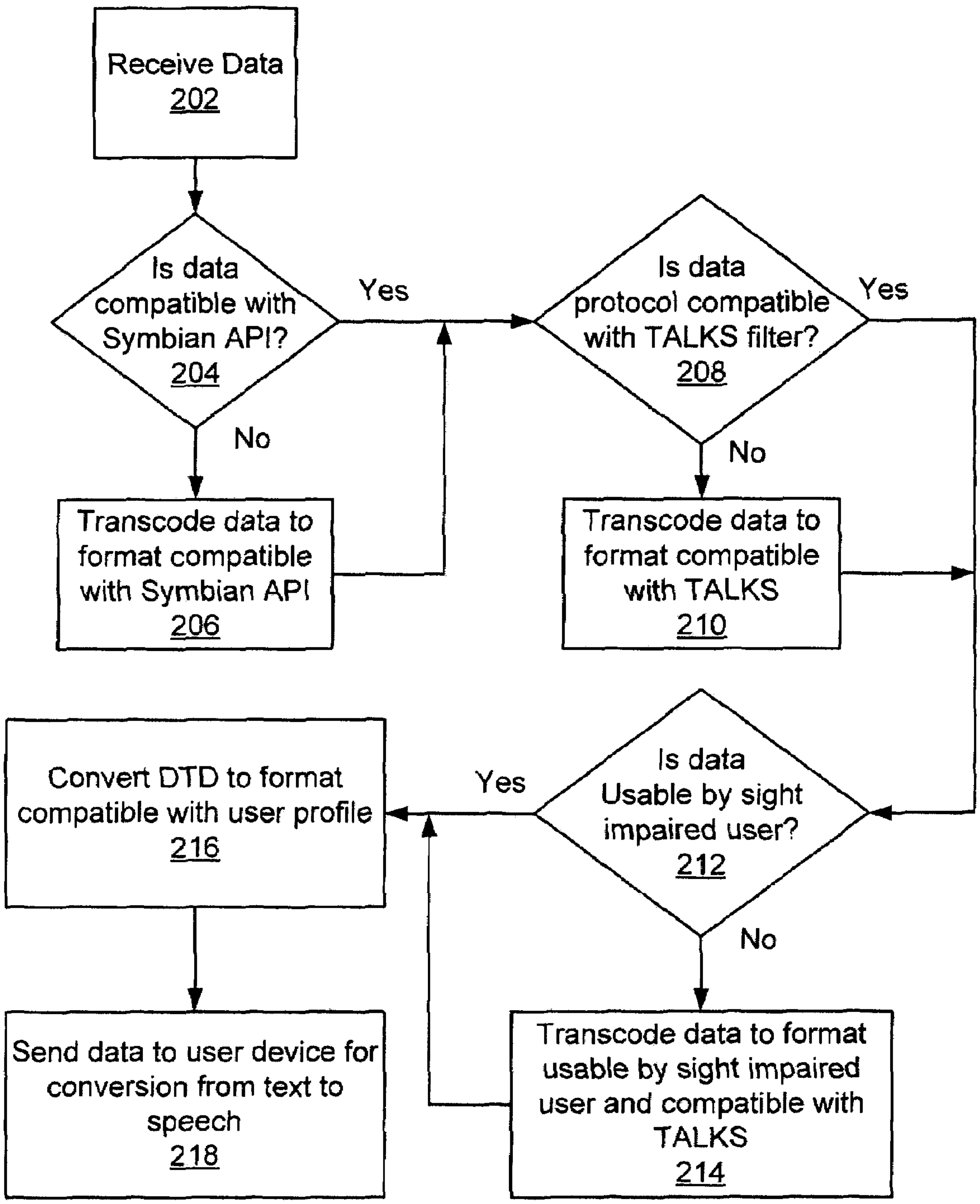
FIG. 2 illustrates a block diagram of an exemplary method for processing data for sight impaired mobile access.

The transcoder 105 transcodes the received data signal so that the signal may be processed in the PAS 107. The transcoder 105 operates with three different transcoding methods. A block diagram of an exemplary method is illustrated in FIG. 2. Referring to FIG. 2, data is received in block 202. In block 204 it is determined whether the data is compatible with the Symbian API. If the data is not compatible with the Symbian API, a first transcoding method is used in block 206. The first transcoding method is used when the HTML page does not use the Symbian API. When a HTML page is received that uses protocols such as, for example, WebServices, Midlet, Applet or J2Me, the HTML page is transcoded into a format that may be used by the Symbian browser. The transcoding replaces the protocols with portlets (vectors) that make the HTML page manageable by the Symbian API. Once the HTML page is transcoded into a format manageable by the Symbian API, a second type of transcoding may be used if necessary to convert the HTML page for use by the TALKS program. The TALKS program adapts the API functions to accommodate specific user requirements, for example a user with impaired sight.

Once the data is compatible with the Symbian API, block 208 determines whether the data includes protocols compatible with the TALKS program. The TALKS program is a filter used in tables in the Symbian (Mobile Operating System) API. The TALKS program modifies requests from the operating system so that the requests may be used by a text to speech program allowing a sight impaired user to use a device. The transcoder 105 receives 105 data that may include, for example, an HTML page. The transcoder 105 determines whether the HTML page complies with accessibility regulations as per the "MOBILE OK" standard stated in the W3C/WAI (or regulation 508) in block 208. If the HTML page does not comply with the accessibility regulations, the data is transcoded to a format usable by TALKS in block 210.

When the data is in a format usable by TALKS, a third type of transcoding is used with data content that is not generally accessible for a sight impaired user. Such as, for example, a textual online chat may be transcoded into voice chats. The third type of transcoding may also convert proprietary protocols of mail messaging into formats that may be used by TALKS such as, for example POP3, IMAP4, SMS, and MMs. Block 212 determines whether the data is usable by a sight impaired user, and block 214 transcodes the data into a format usable by the sight impaired user.

Once the data is transcoded, the PAS 107 receives the data. The PAS 107 receives and manages data in a variety of formats. The table below includes examples of the data formats that are managed by the PAS 107.

| Data Type | Data Format |
|---|---|
| Browser | HTML, XML, JAVA, JAVA, Web Services |
| Network | Wireless protocol, WiFi, BT |
| Communications Services | SMS, HTTP, MMS, PTT, e-mail, chat, BB, FTP, VoIP, GSM, RealVideo, RealAudio, GPS, Feed RSS |
| Security | Firewall, Antivirus, VPN, HTTP |
| Applications over O.S. | Talks, Java, SIP, SCCP, Office, BB, Symbian, Python |
| Multimedia | TTS's, RealVideo, RealAudio, Podcast |
| Smartphone | Symbian, Power management, Network management |
| HW ergonomics | Keyboard, Audio, Manageability, Portability, Durability |
| Management | Software management, Security Management, File Management |

The PAS 107 translates received data and converts the data in Voice through the TTS function of the TALKS program. The PAS 107 also converts in Voice all of the Device and Application Commands and indications to allow the user mobile device 109 to manage and navigate applications that the User requests and receives.

The PAS 107 converts data formats based on Data Type Definition (DTD) rules. The data formats of the data are the rules with which the data is to be processed by the application programs. For example, a specific grammar with which the rules are universally written is called XML/DTD. The grammar has formal regulations documented as the DTD. DTDs are often publicized on the Internet website www.w3.org. For example, when the PAS 107 receives a string of bits with content data intended for a user including DTS data: <rss version='2.0' xmlns:itunes='http://www.itunes.com/dtds/podcast-1.0.dtd'>, the PAS 102 will address the content data unchanged to the user. The URL (http://www.itunes.com/dtds/podcast-1.0dtd), where the DTD resides accompanies the content data. The PAS 107 receives the DTD, and analyzes the rules and verifies that the rules are compatible with rules in a user profile associated with the user. If the rules are not compatible with the user profile, the PAS 107 will convert the rules in the DTS to a new DTS compatible with the user profile. The conversion of the DTS occurs in block 216.

Once the PAS 107 processes the data, the accessibility engine 103 sends the data to the user mobile device 109 in block 218. The user mobile device 109 in this embodiment includes a text to speech engine 111 that receives text and converts the text into audible speech. In other embodiments the text to speech engine 111 may be included in the accessibility engine 103.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for sending data to a sight impaired user, the method comprising:

receiving data from a data resource;

processing the received data, wherein the processing includes:

determining whether the data is compatible with a Symbian API;

transcoding the data into a first format compatible with the Symbian API responsive to determining that the data is not compatible with the Symbian API;

determining whether the data is compatible with a TALKS filter;

transcoding the data into a second format compatible with the TALKS filter responsive to determining that the data is not compatible with a TALKS filter;

determining whether the data is usable by a sight impaired user;

transcoding the data into a third format usable by a sight impaired user responsive to determining that the data is not usable by a sight impaired user; and converting a data type definition associated with the data into a format compatible with a user profile; and sending the processed data to a user mobile device, wherein the mobile device is operative to convert the data into an audible output.

* * * * *